United States Patent
Park et al.

(10) Patent No.: US 10,181,480 B2
(45) Date of Patent: Jan. 15, 2019

(54) THIN FILM TRANSISTOR SUBSTRATE AND DISPLAY APPARATUS

(71) Applicant: SAMSUNG DISPLAY CO., LTD., Yongin-si, Gyeonggi-do (KR)

(72) Inventors: Sangho Park, Yongin-si (KR); Gyungsoon Park, Yongin-si (KR); Heerim Song, Yongin-si (KR); Donghwan Shim, Yongin-si (KR); Jungkyu Lee, Yongin-si (KR); Seunghwan Cho, Yongin-si (KR); Jonghyun Choi, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 15/631,294

(22) Filed: Jun. 23, 2017

(65) Prior Publication Data
US 2017/0373094 A1  Dec. 28, 2017

(30) Foreign Application Priority Data
Jun. 24, 2016 (KR) .................. 10-2016-0079279

(51) Int. Cl.
*H01L 27/12* (2006.01)
*G09G 3/3233* (2016.01)
*H01L 27/32* (2006.01)

(52) U.S. Cl.
CPC ....... *H01L 27/1222* (2013.01); *G09G 3/3233* (2013.01); *H01L 27/3262* (2013.01);
(Continued)

(58) Field of Classification Search
CPC ............. H01L 27/1222; H01L 27/3262; H01L 27/3265; H01L 27/3276; G09G 3/3233;
(Continued)

(56) References Cited

U.S. PATENT DOCUMENTS 5,953,582 A * 9/1999 Yudasaka ............ G02F 1/13454
438/29
9,196,737 B2 11/2015 Zhan
(Continued)

FOREIGN PATENT DOCUMENTS

KR  1020140053601 A  5/2014
KR  1020140102561 A  8/2014
KR  1020150050058 A  5/2015

*Primary Examiner* — Yosef Gebreyesus
(74) *Attorney, Agent, or Firm* — Cantor Colburn LLP

(57) ABSTRACT

A thin film transistor "TFT") substrate includes a substrate, an active layer over the substrate, and first and second TFTs over the substrate. The active layer includes: a first drain region, a first channel region and a first source region, which function as a drain, a channel and a source of the first TFT: a first lightly doped region between the first drain region and the first channel region: a second lightly doped region between the first channel region and the first source region: and a second drain region, a second channel region and a second source region, which function as a drain, a channel and a source of the second TFT. An impurity concentration at the second drain or source region is lower than an impurity concentration at the first drain or source region and higher than an impurity concentration at the first or second channel region.

20 Claims, 10 Drawing Sheets

(52) U.S. Cl.
CPC ...... *H01L 27/3265* (2013.01); *H01L 27/3276* (2013.01); *G09G 2300/043* (2013.01); *G09G 2300/0842* (2013.01); *G09G 2300/0861* (2013.01); *G09G 2310/0251* (2013.01); *G09G 2310/0262* (2013.01); *G09G 2320/0233* (2013.01); *G09G 2320/043* (2013.01); *G09G 2330/023* (2013.01)

(58) Field of Classification Search
CPC ..... G09G 2300/043; G09G 2300/0842; G09G 2300/0861; G09G 2310/0251; G09G 2310/0262; G09G 2320/0233; G09G 2320/043
See application file for complete search history.

(56) References Cited

U.S. PATENT DOCUMENTS

| | | |
|---|---|---|
| 2005/0007318 A1 | 1/2005 | Kasai et al. |
| 2011/0140183 A1* | 6/2011 | Nagai ............ H01L 21/823412 257/296 |
| 2014/0117340 A1 | 5/2014 | Kim |
| 2014/0167040 A1 | 6/2014 | Lee et al. |
| 2017/0032739 A1 | 2/2017 | Kim et al. |
| 2017/0061880 A1 | 3/2017 | Choi et al. |

* cited by examiner

THIN FILM TRANSISTOR SUBSTRATE AND DISPLAY APPARATUS

This application claims priority to Korean Patent Application No. 10-2016-0079279, filed on Jun. 24, 2016, and all the benefits accruing therefrom under 35 U.S.C. § 119, the content of which in its entirety is herein incorporated by reference.

BACKGROUND

1. Field

One or more embodiments relate to a thin film transistor substrate and a display apparatus, and more particularly, to a thin film transistor substrate including first and second thin film transistors, and a display apparatus including the thin film transistor substrate.

2. Description of the Related Art

A display apparatus, such as an organic light-emitting display apparatus and a liquid crystal display apparatus, may include a plurality of thin film transistors ("TFT"s), capacitors, and wires for connecting the TFTs and the capacitors. Here, a TFT typically includes an active layer that provides a channel region, a source region, and a drain region, and a gate electrode overlapping the channel region and electrically insulated from the active layer via a gate insulating layer.

SUMMARY

An active layer of a thin film transistors ("TFT"), may include a semiconductor material such as polysilicon, and a p-type or an n-type TFT may be obtained according to impurities injected therein. The active layer including polysilicon has an increased mobility, whereas uniformity of a threshold voltage of the active layer including polysilicon is decreased, compared with an active layer including amorphous silicon. Moreover, although an n-type TFT has a greater mobility than that of a p-type TFT, a threshold voltage of the n-type TFT is even more uneven than that of the p-type TFT. When a threshold voltage of a driving TFT is uneven, light having a desired luminance level may not be output, and thus, quality of displayed images degrades. In addition, if an additional circuit is provided to compensate the threshold voltage, pixels become greater, and a resolution decreases. Even if the circuit for compensating for the threshold voltage is added, a voltage margin may increase due to a variation in the threshold voltage, and the power consumption may increase.

One or more embodiments include a thin film transistor ("TFT") substrate having an improved uniformity in a threshold voltage of a driving TFT, and a display apparatus.

According to one or more embodiments, a TFT substrate includes: a substrate; an active layer over the substrate; a first TFT over the substrate; and a second TFT over the substrate. In such embodiments, the active layer includes: a first drain region, a first channel region and a first source region, which function as a drain, a channel and a source of the first TFT, respectively; a first lightly doped region between the first drain region and the first channel region; a second lightly doped region between the first channel region and the first source region; and a second drain region, a second channel region and a second source region, which function as a drain, a channel and a source of the second TFT, respectively. In such embodiments, an impurity concentration at the second drain region and the second source region is lower than an impurity concentration at the first drain region and the first source region and higher than an impurity concentration at the first channel region and the second channel region.

In an embodiment, the impurity concentration at the second drain region and the second source region may be substantially equal to an impurity concentration at the first lightly doped regions and the second lightly doped region.

In an embodiment, each of the first drain region and the first source region may have a first impurity concentration, each of the first and second lightly doped regions, the second drain region and the second source region may have a second impurity concentration which is lower than the first impurity concentration, and each of the first and second channel regions may have a third impurity concentration which is lower than the second impurity concentration.

In an embodiment, a channel length of the second channel region may be greater than a channel length of the first channel region.

In an embodiment, a length of the second source region may be greater than twice a length of the second lightly doped region.

In an embodiment, a length of the second source region may be greater than half a channel width of the second channel region.

In an embodiment, a length of the second source region may be greater than about 1 micrometer (μm).

In an embodiment, the second channel region may be directly connected between the second drain region and the second source region.

In an embodiment, the active layer may further include a wiring region directly connected to at least one of the second drain region and the second source region, and an impurity concentration at the wiring region may be substantially equal to an impurity concentration at the first drain region and the first source region.

In an embodiment, a conductive type of the first and second TFTs may be n-type.

According to one or more embodiments, a display apparatus includes: a substrate; pixels arranged over the substrate, where each of the pixels includes a first TFT, a second TFT, and a display element; and an active layer disposed over the substrate, and including a first drain region, a first lightly doped region, a first channel region, a second lightly doped region, a first source region. In such embodiments, the first TFT includes the first drain region, the first lightly doped region, the first channel region, the second lightly doped region and the first source region, which are continuously arranged along a lengthwise direction thereof, the second TFT includes the second drain region, the second channel region and the second source region, which are continuously arranged along a lengthwise direction thereof, and an impurity concentration at the second drain region and the second source region is substantially equal to an impurity concentration at the first and second lightly doped regions.

In an embodiment, each of the first drain region and the first source region may have a first impurity concentration, each of the first and second lightly doped regions, the second drain region and the second source region may have a second impurity concentration which is lower than the first impurity concentration, and each of the first and second channel regions may have a third impurity concentration which is lower than the second impurity concentration.

In an embodiment, the active layer may further include a wiring region directly connected to at least one of the second drain region and the second source region, and the wiring region may have the first impurity concentration.

In an embodiment, an area of the second drain region or the second source region may be respectively greater than twice an area of the first or second lightly doped region.

In an embodiment, the second TFT may generate a driving current corresponding to a voltage between a gate electrode overlapping with the second channel region and the second source region, and the second TFT may output the driving current to a pixel electrode.

In an embodiment, a channel length of the second TFT may be greater than twice a channel length of the first TFT.

In an embodiment, the display apparatus may further include a gate line over the substrate and a data line over the substrate, where a part of the gate line may overlap with the first channel region to function as a gate electrode of the first TFT, and the data line may be connected to the first source region.

In an embodiment, the display apparatus may further include first to third gate lines which transfer a scan signal, a first control signal and a second control signal, respectively, and a data line which transfers a data signal.

In an embodiment, each of the pixels may include: a driving transistor including a gate electrode connected to a first node, a drain connected to a second node, and a source connected to a third node; a storage capacitor connected between the first node and a fourth node; a switching transistor which transfers the data signal to the fourth node in response to the scan signal; an initialization transistor which transfers an initialization voltage to the third node in response to the scan signal; a compensation transistor which connects the first node to the second node in response to the scan signal; a first control transistor which connects the third node to the fourth node in response to the first control signal; a second control transistor which applies a first driving voltage to the second node in response to the second control signal; and the display element having an anode connected to the third node and a cathode to which a second driving voltage is applied.

In an embodiment, the second TFT may be the driving transistor, and the first TFT may be at least one of the switching transistor, the initialization transistor, the compensation transistor, the first control transistor and the second control transistor.

In an embodiment, a conductive type of the first and second TFTs may be n-type.

BRIEF DESCRIPTION OF THE DRAWINGS

These and/or other features will become apparent and more readily appreciated from the following description of the embodiments, taken in conjunction with the accompanying drawings, in which.

DETAILED DESCRIPTION

Figure 1:
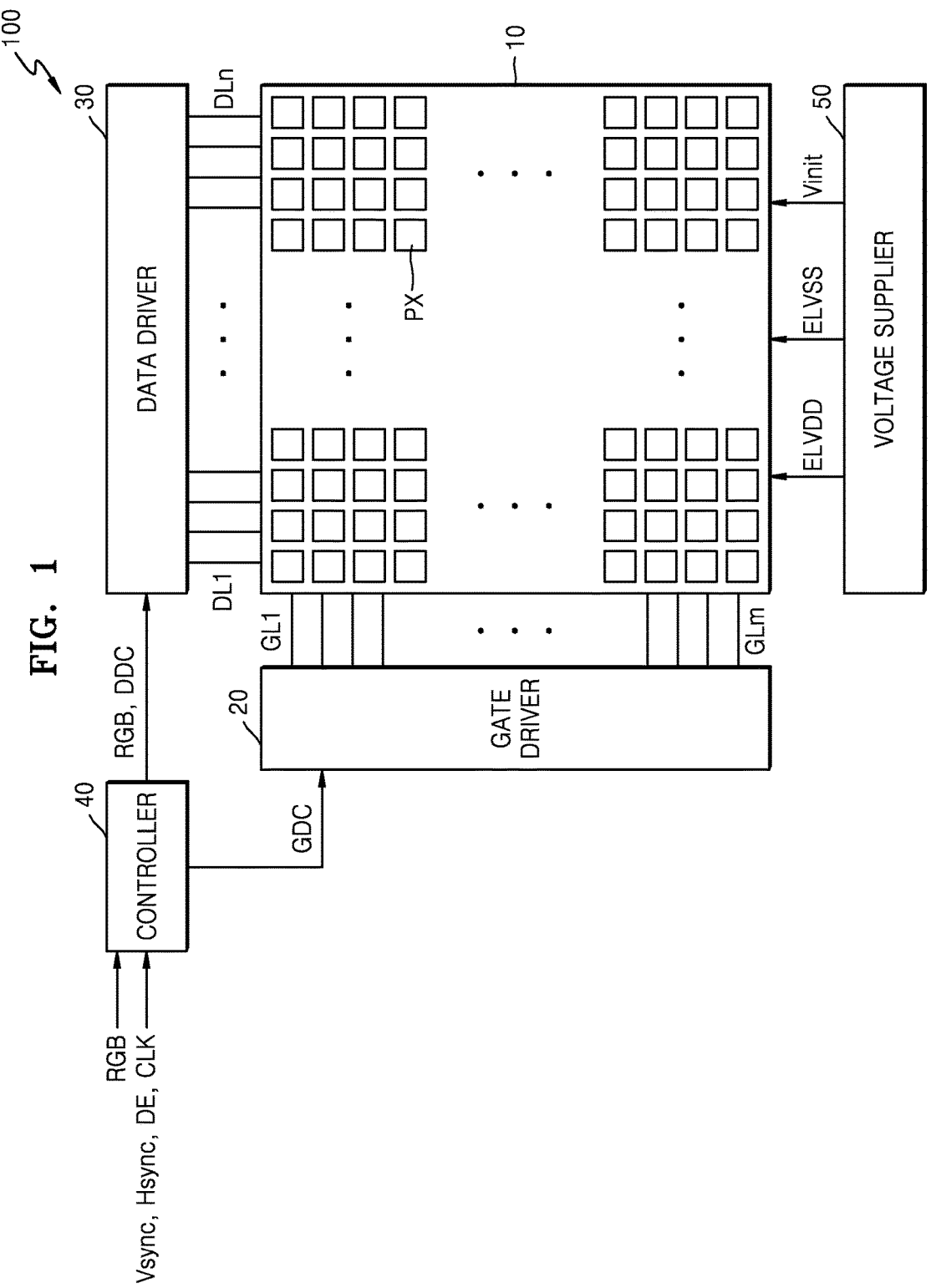
FIG. 1 is a schematic block diagram of a display apparatus according to an embodiment.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. Expressions such as "at least one of," when preceding a list of elements, modify the entire list of elements and do not modify the individual elements of the list.

In the present specification, it is to be understood that the terms such as "including," "having," and "comprising" are intended to indicate the existence of the features, numbers, steps, actions, components, parts, or combinations thereof disclosed in the specification, and are not intended to preclude the possibility that one or more other features, numbers, steps, actions, components, parts, or combinations thereof may exist or may be added.

It will be understood that when a layer, region, or component is referred to as being "on" another layer, region, or component, it can be directly or indirectly on the other layer, region, or component. That is, for example, intervening layers, regions, or components may be present.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system).

Sizes of components in the drawings may be exaggerated for convenience of explanation. In other words, since sizes and thicknesses of components in the drawings are arbitrarily illustrated for convenience of explanation, the following embodiments are not limited thereto.

When a certain embodiment may be implemented differently, a specific process order may be performed differently from the described order. For example, two consecutively described processes may be performed substantially at the same time or performed in an order opposite to the described order.

Exemplary embodiments will be described below in detail with reference to the accompanying drawings. Those components that are the same or are in correspondence are rendered the same reference numeral regardless of the figure number, and any repetitive detailed description thereof may be omitted.

FIG. 1 is a schematic block diagram of a display apparatus 100 according to an embodiment.

Referring to FIG. 1, an embodiment of the display apparatus 100 includes a display panel 10, a gate driver 20, a data driver 30, a controller 40, and a voltage supplier 50.

In an embodiment, the display apparatus 100 may be an organic light-emitting display apparatus including a plurality of pixels PX, each of which includes an organic light-emitting device such as an organic light-emitting diode. Alternatively, the display apparatus 100 may be a liquid crystal display apparatus including a liquid crystal layer. Hereinafter, for convenience of description, embodiments of the display apparatus 100 including the organic light-emitting devices, e.g., an organic light-emitting display apparatus, will be described in detail, but one or more embodiments are not limited thereto.

In such an embodiment, the display panel 10 includes the plurality of pixels PX arranged substantially in a matrix form. Each of the pixels PX includes a light-emitting device, such as an organic light-emitting diode, as a display element, and a pixel circuit for driving the light-emitting device. Alternatively, the display element may be a liquid crystal capacitor.

Each of the pixels PX is connected to a corresponding gate line from among gate lines GL1 to GLm and a corresponding data line from among data lines DL1 to DLn. Each of the gate lines GL1 to GLm transfers at least one control signal output from the gate driver 20 to pixels PX of a same row. Each of the data lines DL1 to DLn transfers a data signal output from the data driver 30 to the pixels PX of a same column. In FIG. 1, each of the gate lines GL1 to GLm is shown as a line, but each of the gate lines GL1 to GLm may include a plurality of lines for transferring a plurality of control signals including a scan signal in parallel to correspond to a pixel circuit.

The voltage supplier 50 may supply a first driving voltage ELVDD and a second driving voltage ELVSS to the pixels PX. The first driving voltage ELVDD and the second driving voltage ELVSS are voltages for driving the pixel circuit to allow the light-emitting device to emit light of a desired luminance, and the first driving voltage ELVDD may have a higher level than the second driving voltage ELVSS. As shown in FIG. 1, the voltage supplier 50 may supply an initializing voltage Vinit to the pixels PX to correspond to the pixel circuit. In an embodiment, the initializing voltage Vinit is a voltage used for operating the pixel circuit, and may have a voltage level that is similar to that of the second driving voltage ELVSS. According to an alternative embodiment, the initializing voltage Vinit may have a voltage level that is similar to that of the first driving voltage ELVDD. In such an embodiment, the initializing voltage Vinit may be variously modified to correspond to the pixel circuit and conductive types of thin film transistors ("TFT"s) in the pixels PX.

The pixel circuit may control an amount of electric current flowing from the first driving voltage ELVDD to the second driving voltage ELVSS via the light-emitting device, based on a voltage level of the data signal transferred through the data line. The data signal is a signal having a voltage level to be applied to a pixel circuit via the data line, and may be referred to as a data voltage. The light-emitting device of the pixel PX emits light with a luminance determined by the voltage level of the data signal. The pixel PX may be a part of a unit pixel for displaying a full-color image, e.g., a sub-pixel.

The controller 40 receives timing signals, such as a vertical synchronization signal Vsync, a horizontal synchronization signal Hsync, a data enable signal DE and a clock signal CLK, and image data RGB from an external device. The controller 40 may control operation timings of the gate driver 20 and the data driver 30 based on the received timing signals. In an embodiment, the controller 40 may determine one frame period by counting data enable signals DE during one horizontal scanning period. In such an embodiment, the controller 40 may not receive the vertical synchronization signal Vsync and the horizontal synchronization signal Hsync from the external device. The image data RGB includes luminance information of the pixels PX. The luminance has gray levels corresponding to a predetermined number, e.g., 1024, 256, or 64 gray levels.

The controller 40 may generate control signals including a gate timing control signal GDC for controlling operation timings of the gate driver 20 and a data timing control signal DDC for controlling operation timings of the data driver 30.

The gate timing control signal GDC may include a gate start pulse, a gate shift clock, and a gate output enable signal. The gate start pulse may be output to a gate driving circuit that outputs a first scan signal. The gate shift clock is a clock signal commonly input to the gate driver 20 for shifting the gate start pulse. The gate output enable signal controls an output from the gate driver 20.

The data timing control signal DDC may include a source start pulse, a source sampling clock, and a source output enable signal. The source start pulse controls a data sampling start point of the data driver 30. The source sampling clock is a clock signal for controlling data sampling operations in the data driver 30 based on a rising edge or a falling edge. The source output enable signal controls an output from the data driver 30. Alternatively, the source start pulse supplied to the data driver 30 may be omitted, based on a data transmission method.

The gate driver 20 sequentially generates control signals for driving the TFTs of the pixels PX, in response to the gate timing control signal GDC. The gate driver 20 supplies the control signals to the pixels PX in the display panel 10 via the gate lines GL1 to GLm. A plurality of control signals including a scan signal may be supplied to a pixel PX to correspond to the pixel circuit.

The data driver 30 converts image data RGB in a digital format into image data in parallel data format, by sampling and latching the image data RGB of the digital format in response to the data timing control signal DDC. The data driver 30 converts the image data in the parallel data format into a data signal in an analog format having a voltage level, by using a gamma reference voltage. The data driver 30 supplies data signals to the pixels PX via the data lines DL1 to DLn.

Hereinafter, the pixels PX according to one or more embodiments will be described in detail.

Figure 2:
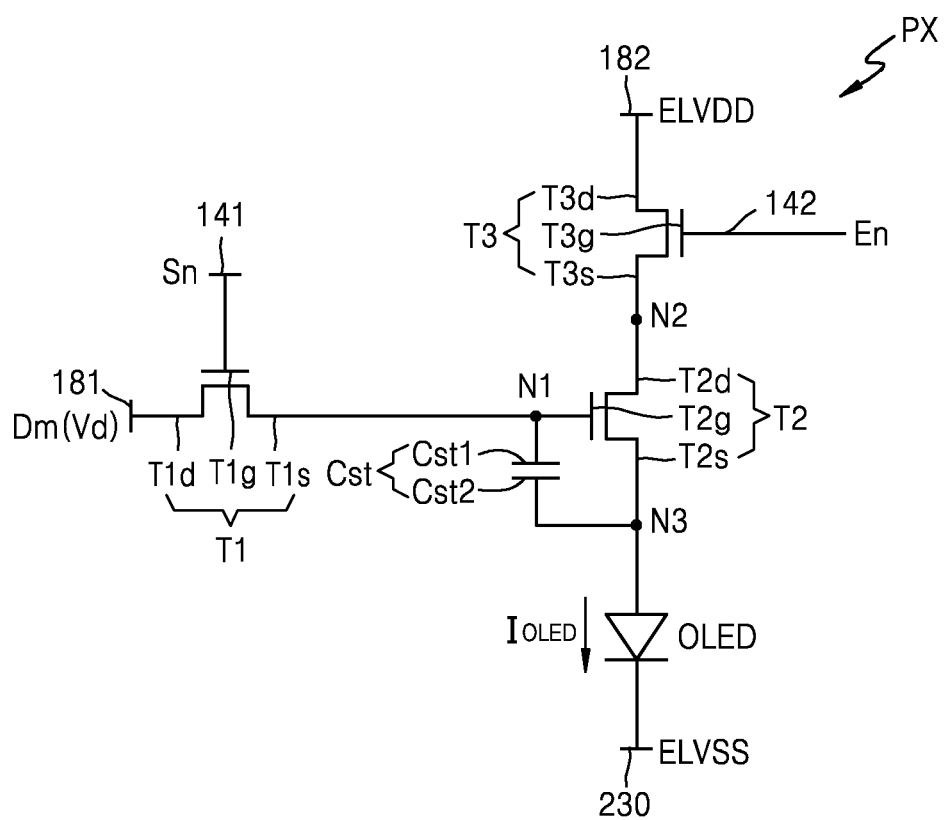
FIG. 2 is an equivalent circuit diagram of a pixel according to an embodiment.

FIG. 2 is an equivalent circuit diagram of a pixel PX according to an embodiment.

Referring to FIG. 2, an embodiment of the pixel PX includes a pixel circuit including first to third TFTs T1, T2 and T3 and a storage capacitor Cst, and an organic light-emitting diode OLED. The pixel circuit is connected to first and second gate lines 141 and 142, a data line 181, and a power line 182. The pixel PX may be one pixel PX included in the display apparatus of FIG. 1. Such an embodiment of the pixel PX shown in FIG. 2 is merely exemplary, and one or more embodiments are not limited thereto.

The first to third TFTs T1, T2 and T3 may be referred to as a switching transistor T1, a driving transistor T2 and a control transistor T3, respectively. In such an embodiment, a gate T2g of the driving transistor T2 is defined as a first node N1, a drain T2d of the driving transistor T2 is defined as a second node N2, and a source T2s of the driving transistor T2 is defined as a third node N3. In FIG. 2, the first to third TFTs T1, T2 and T3 are shown as n-type metal-oxide-semiconductor ("MOS") transistors, but are not limited thereto. Alternatively, the pixel PX may include TFTs that are p-type MOS transistors.

The first gate line 141 transfers a scan signal Sn to a gate T1g of the switching transistor T1, and the second gate line 142 transfers a control signal En to a gate T3g of the control transistor T3. The data line 181 transfers a data signal Dm having a data voltage Vd to a drain T1d of the switching transistor T1, and the power line 182 transfers the first driving voltage ELVDD to a drain Td3 of the control transistor T3. A common electrode 230 applies the second driving voltage ELVSS to a cathode of the organic light-emitting diode OLED.

The switching transistor T1 includes the gate T1g connected to the first gate line 141, the drain T1d connected to the data line 181, and the source T1s connected to the first node N1. The switching transistor T1 may transfer the data signal Dm to the first node N1 in response to the scan signal Sn. The data voltage Vd of the data signal Dm is applied to a first capacitor electrode Cst1 and stored in the storage capacitor Cst.

The driving transistor T2 includes the gate T2g connected to the first node N1, the drain T2d connected to the second node N2, and the source T2s connected to the third node N3. The driving transistor T2 generates a driving current $I_{OLED}$ corresponding to a voltage obtained by subtracting a threshold voltage of the driving transistor T2 from a voltage between opposite terminals of the storage capacitor Cst connected between the gate T2g and the source T2s, and outputs the driving current $I_{OLED}$ to the organic light-emitting diode OLED.

The control transistor T3 includes a gate T3g connected to the second gate line 142, a drain T3d connected to the power line 182, and a source T3s connected to the second node N2. When the control transistor T3 is turned on in response to the control signal En applied through the second gate line 142, a current path is formed between the power line 182 and the common electrode 230 via the driving transistor T2.

The storage capacitor Cst includes the first capacitor electrode Cst1 connected to the first node N1, and a second capacitor electrode Cst2 connected to the third node N3. The storage capacitor Cst stores the data voltage Vd transferred through the switching transistor T1.

The organic light-emitting diode OLED includes an anode connected to the third node N3, and a cathode connected to the common electrode 230. The organic light-emitting diode OLED emits light by receiving the driving current $I_{OLED}$ output from the driving transistor T2.

An operation of the pixel PX according to an embodiment will hereinafter be described in detail.

When the control signal En of a low level is applied to the second gate line 142, the control transistor T3 is turned off, and the current path between the power line 182 and the common electrode 230 via the driving transistor T2 is blocked such that the organic light-emitting diode OLED does not emit light. The switching transistor T1 transfers the data signal Dm transferred through the data line 181 to the first node N1, in response to the scan signal Sn of a high level. The storage capacitor Cst stores the data voltage Vd of the data signal Dm. Since the storage capacitor Cst is connected between the gate T2g and the source T2s of the driving transistor T2, the driving transistor T2 may generate the driving current $I_{OLED}$ corresponding to the voltage obtained by subtracting the threshold voltage of the driving transistor T2 from the voltage stored in the storage capacitor Cst.

When the control signal En of a high level is applied to the second gate line 142, the control transistor T3 is turned on, and a current path is formed between the power line 182 and the common electrode 230 via the driving transistor T2. Accordingly, the driving current $I_{OLED}$ output from the driving transistor T2 flows through the organic light-emitting diode OLED, and the organic light-emitting diode OLED emits light having a luminance corresponding to the driving current $I_{OLED}$.

When a same data voltage Vd is stored in the storage capacitor Cst, the driving transistor T2 may output the driving current $I_{OLED}$ of a same magnitude provided that the threshold voltage of the driving transistor T2 is constant. However, if the threshold voltage of the driving transistor T2 is not constant, the magnitude of the driving current $I_{OLED}$ may vary depending on pixels PX, and the luminance of the light emitting from the organic light-emitting diode OLED may also vary. That is, the organic light-emitting diode OLED may not emit light of a desired luminance, and a desired image may not be displayed. Therefore, if the threshold voltages of the driving transistors T2 in all the pixels PX are constant, quality of images to be displayed may be improved.

Hereinafter, a structure of the pixel PX shown in FIG. 2 will be described with reference to FIGS. 3 and 4.

Figure 3:
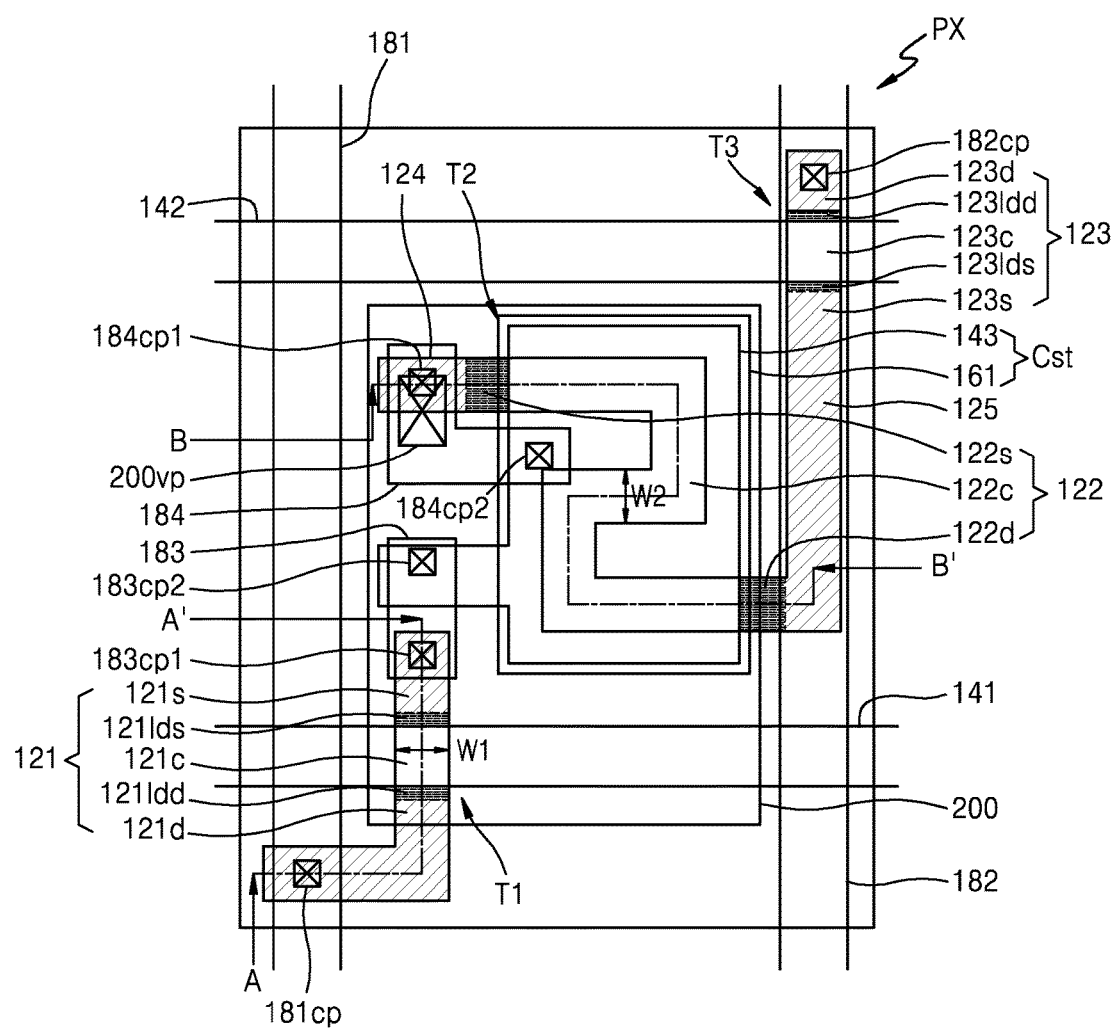
FIG. 3 is a plan view exemplarily showing arrangements of thin film transistors ("TFT"s), a storage capacitor, and a pixel electrode in the pixel of FIG. 2.
Figure 4:
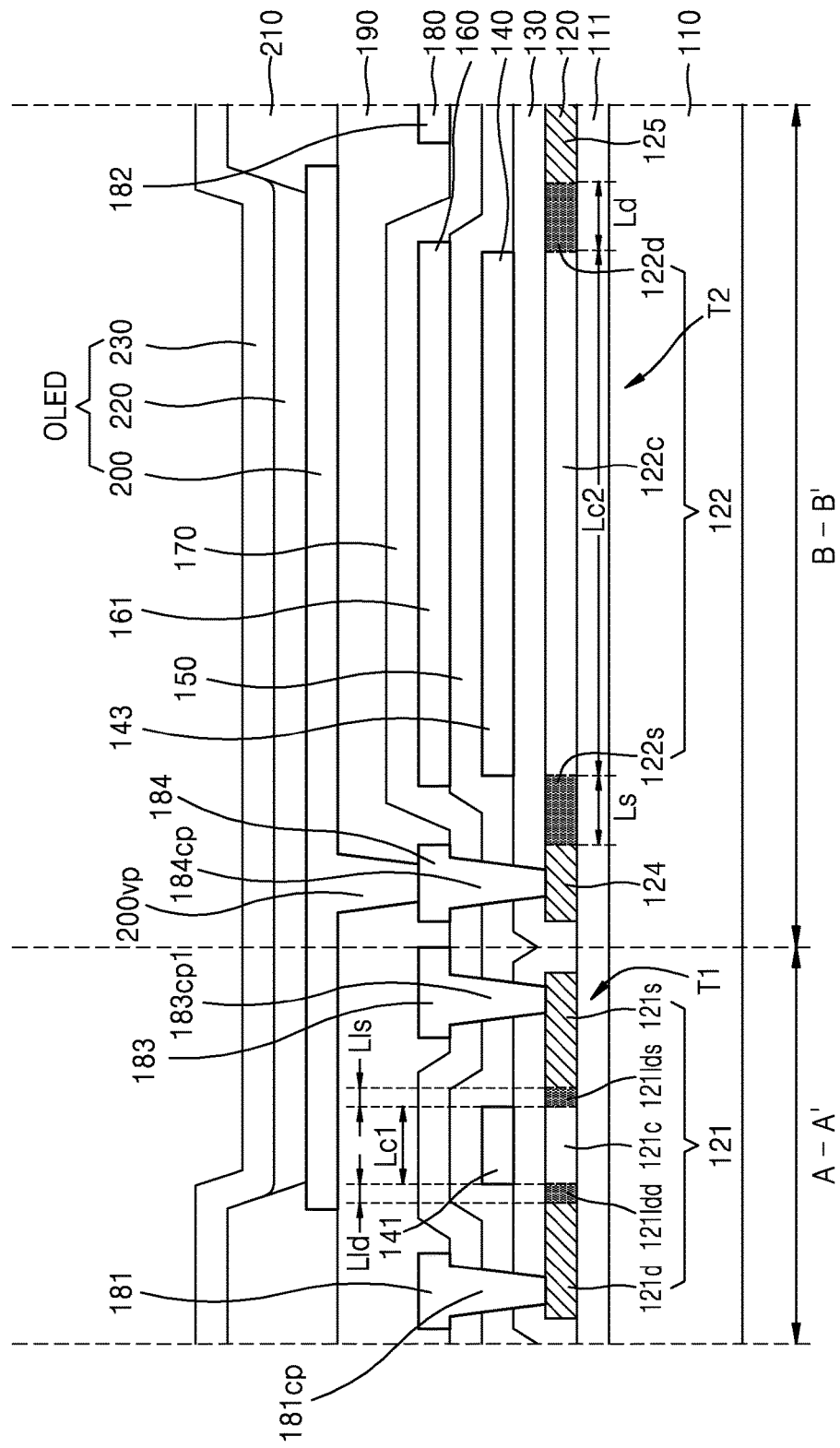
FIG. 4 is a cross-sectional view taken along line A-A' and line B-B' of FIG. 3.

FIG. 3 is a plan view exemplarily showing arrangements of the TFTs, the storage capacitor, and the pixel electrode in the pixel PX of FIG. 2, and FIG. 4 is a cross-sectional view taken along line A-A' and line B-B' of FIG. 3.

Referring to FIGS. 2 and 3, an embodiment of the pixel PX includes the TFTs T1, T2 and T3, the storage capacitor Cst, and the organic light-emitting diode OLED electrically connected to the TFTs T1, T2 and T3 and the storage capacitor Cst. The second TFT T2, that is, the driving transistor, outputs a source current that is determined based on a gate-source voltage between the gate and the source. A magnitude of the source current continuously changes according to the gate-source voltage, and thus, the second TFT T2 is an analog transistor. The first TFT T1 referred to as the switching transistor and the third TFT T3 referred to as the control transistor are transistors functioning as switches that are turned on or turned off in response to the voltage applied to the gate. Hereinafter, the first TFT T1 will be described in detail with reference to FIG. 4, and such a description of the first TFT T1 may be applied to the third TFT T3.

The pixel PX is connected to the first gate line 141 and the second gate line 142, which respectively transfer the scan signal Sn and the control signal En and extend in a row direction. The pixel PX is also connected to the data line 181 that extends in a column direction and transfers the data signal Dm having a data voltage Vd. The pixel PX is connected to the power line 182 that extends in the column direction and transfers the first driving voltage EVLDD.

Hereinafter, the description will be provided in a stack order for convenience of description.

Referring to FIGS. 3 and 4, the pixel PX may include a substrate 110, a buffer layer 111 on the substrate 110, an active layer 120 on the buffer layer 110, a first insulating layer 130 on the active layer 120, a first conductive layer 140 on the first insulating layer 130, a second insulating layer 150 on the first conductive layer, a second conductive layer 160 on the second insulating layer 150, a third insulating layer 170 on the second conductive layer 160, a third conductive layer 180 on the third insulating layer 170, a fourth insulating layer 190 on the third conductive layer 180, and an organic light-emitting diode OLED on the fourth insulating layer 190. The organic light-emitting diode OLED includes a pixel electrode 220, an emission layer 220, and a common electrode 230.

Referring to FIGS. 3 and 4, the pixel PX may include a substrate 110, a buffer layer 111 on the substrate 110, an active layer 120 on the buffer layer 111, a first insulating layer 130 on the active layer 120, a first conductive layer 140 on the first insulating layer 130, a second insulating layer 150 on the first conductive layer, a second conductive layer 160 on the second insulating layer 150, a third insulating layer 170 on the second conductive layer 160, a third conductive layer 180 on the third insulating layer 170, a fourth insulating layer 190 on the third conductive layer 180, and an organic light-emitting diode OLED on the fourth insulating layer 190. The organic light-emitting diode OLED includes a pixel electrode 220, an emission layer 220, and a common electrode 230.

The buffer layer 111 may be on the substrate 110 to prevent impurity ions from dispersing and external moisture or external air from infiltrating, and to provide a planarized surface. The buffer layer 111 may include an oxide layer such as silicon oxide (SiOx) and/or a nitride layer such as silicon nitride (SiNx).

The active layer 120 includes a first active region 121 of the first TFT T1, a second active region 122 of the second TFT T2, and a third active region 123 of the third TFT T3. As shown in FIGS. 3 and 4, the active layer 120 may include first and second wiring regions 124 and 125 that are conductive.

The active layer 120 may be curved in various shapes according to design, as shown in FIG. 3. In an embodiment, the regions 121 to 125 of the active layer 120 may be connected to one another to make a line. Alternatively, as shown in FIG. 3, the first active region 121 of the active layer 120 may be isolated from the other regions 122 to 125 that are connected to one another.

The active layer 120 may include polycrystalline silicon. According to another example, the active layer 120 may include oxide semiconductor such as amorphous silicon or a $In_2O_3)_a(Ga_2O_3)_b(ZnO)_c$ (ZnO)—O I layer (a, b, and c are respectively integers satisfying conditions of a≥0, b≥0 and c>0). Hereinafter, an embodiment where the active layer 120 includes polycrystalline silicon will be described in detail for convenience of description.

The first active region 121 included in the first TFT T1 may include a first drain region 121d, a first lightly doped drain region 121ldd, a first channel region 121c, a first lightly doped source region 121lds, and a first source region 121s. The first drain region 121d functions as a drain of the first TFT T1, the first channel region 121c functions as a channel of the first TFT T1, and the first source region 121s functions as a source of the first TFT T1.

In an embodiment, an impurity concentration of the first lightly doped drain region 121ldd is lower than an impurity concentration of the first drain region 121d and is higher than an impurity concentration of the first channel region 121c. In such an embodiment, an impurity concentration of the first lightly doped source region 121lds is lower than an impurity concentration of the first source region 121s and is higher than the impurity concentration of the first channel region 121c.

The first lightly doped drain region 121ldd and the first lightly doped source region 121lds are respectively located between the first drain region 121d and the first channel region 121c and between the first channel region 121c and the first source region 121s. The first lightly doped drain region 121ldd and the first lightly doped source region 121lds may effectively prevent a strong electric field from being induced between the first drain region 121d and the first channel region 121c and between the first channel region 121c and the first source region 121s.

When a strong electric field is induced between the first drain region 121d and the first channel region 121c and between the first channel region 121c and the first source region 121s, a short channel effect or a hot electron effect may occur, and accordingly, a leakage current may increase and an off-current characteristic may degrade. In addition, degradation of the transistor may be accelerated due to the strong electric field.

Such a structure of a TFT capable of decreasing the leakage current and improving the off-current characteristic by disposing the first lightly doped drain region 121ldd and the first lightly doped source region 121lds respectively between the first drain region 121d and the first channel region 121s and between the first channel region 121c and the first source region 121s may be referred to as a lightly doped drain ("LDD") structure. In an embodiment, the first TFT T1 has an LDD structure.

The second active region 122 included in the second TFT T2 may include a second drain region 122d, a second channel region 122c, and a second source region 122s. The second drain region 122d may function as a drain of the second TFT T2, the second channel region 122c may function as a channel of the second TFT T2, and the second source region 122s may function as a source of the second TFT T2.

The second drain region 122d is directly connected to the second channel region 122c, and the second source region 122s is directly connected to the second channel region 122c. In such an embodiment, regions corresponding to the first lightly doped drain region 121ldd and the first lightly doped source region 121lds are not provided between the second drain region 122d and the second channel region 122c and between the second channel region 122c and the second source region 122s. In an embodiment, the second TFT T2 does not have an LDD structure.

As shown in FIG. 3, the second source region 122s is directly connected to the first wiring region 124, and is connected to the pixel electrode 200 of the organic light-emitting diode OLED via the first wiring region 124. The second drain region 122d is directly connected to the second wiring region 125, and is connected to the third TFT T3 via the second wiring region 125.

The first and second wiring regions 124 and 125 are not included in the second TFT T2, but connect the second TFT T2 to another device. That is, a boundary between the first wiring region 124 and the second source region 122s and a boundary between the second wiring region 125 and the second drain region 122d are sufficiently spaced apart from the second channel region 122c not to be directly affected by the electric field induced by the gate of the second TFT T2.

The third active region 123 included in the third TFT T3 may include a third drain region 123d, a second lightly doped drain region 123ldd, a third channel region 123c, a second lightly doped source region 123lds, and a third source region 123s. The third drain region 123d may function as a drain of the third TFT T3, the third channel region 123c may function as a channel of the third TFT T3, and the third source region 123s may function as a source of the third TFT T3.

The second lightly doped drain region 123ldd and the second lightly doped source region 123lds may effectively prevent a strong electric field from being induced between the third drain region 123d and the third channel region 123c and between the third channel region 123c and the third source region 123s, where the strong electric field causes a short channel effect or a hot electron effect between the third drain region 123d and the third channel region 123c and between the third channel region 123c and the third source region 123s and thus increases the leakage current and degrades the off-current characteristic.

The third drain region 123d, the second lightly doped drain region 123ldd, the third channel region 123c, the second lightly doped source region 123lds, and the third source region 123s correspond respectively to the first drain region 121d, the first lightly doped drain region 121ldd, the first channel region 121c, the first lightly doped source region 121lds, and the first source region 121s, and any repetitive detailed descriptions thereof will be omitted.

The active layer 120 includes a conductive region including impurities at a first impurity concentration, a lightly doped region including impurities at a second impurity concentration that is lower than the first impurity concentration, and a channel region including impurities at a third impurity concentration that is lower than the second impurity concentration. The channel region may be a region where a channel, through which an electric current may flow due to the electric field, is formed, and may include very few impurities.

The conductive region including impurities at the first impurity concentration may include the first drain region 121d, the first source region 121s, the third drain region 123d, and the third source region 123s. The conductive region may further include the first and second wiring regions 124 and 125. The lightly doped region including the impurities at the second impurity concentration may include the first lightly doped drain region 121ldd, the first lightly doped source region 121lds, the second lightly doped drain region 123ldd, and the second lightly doped source region 123lds. The channel region including the impurities at the third impurity concentration may include the first to third channel regions 121c, 122c, and 123c.

The impurity concentration of the second drain region 122d and the second source region 122s may be lower than the first impurity concentration and higher than the third impurity concentration. The impurity concentration of the second drain region 122d and the second source region 122s may be substantially the same as the impurity concentration of the first lightly doped drain region 121ldd and the first lightly doped source region 121lds. The second drain region 122d and the second source region 122s may have the second impurity concentration. The lightly doped region may further include the second drain region 122d and the second source region 122s.

The impurities may include, for example, n-type impurities such as phosphor (P), arsenic (As) or antimony (Sb), e.g., group-V materials, or p-type impurities such as boron (B), gallium (Ga) or indium (In), e.g., group-III materials. In an embodiment, as shown in FIG. 2, the TFTs T1, T2, and T3 are n-type MOS transistors, and thus, the active layer 120 may include n-type impurities, but is not limited thereto. Alternatively, the active layer 120 may include p-type impurities.

The second TFT T2 is a driving transistor generating the driving current $I_{OLED}$. A voltage of a large driving range may be applied to the gate of the second TFT T2 to accurately adjust the magnitude of the driving current $I_{OLED}$. In an embodiment, a channel length Lc2 of the second channel region 122c in the second TFT T2 may be longer than a channel length Lc1 of the first TFT T1 that functions as a switching transistor, to accurately adjust the magnitude of the driving current $I_{OLED}$. In one embodiment, for example, the channel length Lc2 of the second channel region 122c may be longer than twice the channel length Lc1 of the first channel region 121c.

A channel width W2 of the second channel region 122c may be substantially the same as a channel width W1 of the first channel region 121c. The channel widths W1 and W2 may be determined based on manufacturing processes and critical dimensions of a manufacturing apparatus. The active layer 120 may have a width that is substantially equal to the channel widths W1 and W2, and constant in a lengthwise direction thereof.

In an embodiment, the second TFT T2 may not have the LDD structure. In such an embodiment, a length Ld of the second drain region 122d and a length Ls of the second source region 122s are substantially longer than a length Lld of the first lightly doped drain region 122ldd and a length Lls of the first lightly doped source region 121lds, so that the first wiring region 124 and the second wiring region 125 may function as wirings for connecting the second TFT T2 to another device without functioning as the source and the drain of the second TFT T2.

According to an embodiment, the length Ld of the second drain region 122d may be greater than twice the length Lld of the first lightly doped drain region 121ldd. The length Ls of the second source region 122s may be greater than twice the length Lls of the first lightly doped source region 121lds.

According to an embodiment, the length Ld of the second drain region 122d may be greater than half the channel width W2 of the second channel region 122c. The length Ls of the second source region 122s may be greater than half the channel width W2 of the second channel region 122c.

According to an embodiment, the length Ld of the second drain region 122d may be greater than about 1 micrometer (μm). The length Ls of the second source region 122s may be greater than about 1 μm.

According to an embodiment, a planar area of the second drain region 122*d* may be greater than twice a planar area of the first lightly doped drain region 121*ldd*. A planar area of the second source region 122*s* may be greater than twice a planar area of the first lightly doped source region 121*lds*. Herein, the planar area may be defined as an area when viewed from a plan view, e.g., a top plan view as shown in FIG. 3.

The second drain region 122*d* that is lightly doped and the second source region 122*s* that is lightly doped respectively function as the drain and the source of the second TFT T2, and are directly connected to the second channel region 122*c*, and thus, the second TFT T2 does not have an LDD structure. When a TFT has an LDD structure, generation of a strong electric field may be prevented, and thus, leakage current may decrease. However, when a TFT has an LDD structure a threshold voltage of the TFT may be inconsistent.

According to one or more embodiments, the first TFT T1 operating as a switching transistor has an LDD structure, whereas the second TFT T2 operating as an analog transistor does not have an LDD structure. In such an embodiment, the threshold voltage of the second TFT T2 may not become inconsistent. That is, uniformity of the threshold voltages of the second TFTs T2 may be improved. Although the second TFT does not have the LDD structure, the impurity concentrations of the second source region 122*s* and the second drain region 122*d* are low, a strong electric field does not occur at boundaries of the second channel region 122*c*, and the leakage current may not increase. In such an embodiment, since the channel length Lc2 of the second channel region 122*c* is effectively long, the leakage current does.

When the impurity concentrations of the second source region 122*s* and the drain region 122*d* are low, the threshold voltage increases and the channel resistance also increases, such that the driving voltage may increase. However, as described above, since the second TFT T2 functions as the driving transistor, increase in the driving range of the gate voltage does not cause a problem. Therefore, according to one or more embodiments, the second TFT T2 operating as the driving transistor may not have the LDD structure, such that the uniformity of the threshold voltages may be improved.

As illustrated with reference to FIG. 3, the first active region 121 of the first TFT T1 includes the first drain region 121*d*, the first lightly doped drain region 121*ldd*, the first channel region 121*c*, the first lightly doped source region 121*lds*, and the first source region 121*s*. The first drain region 121*d* is connected to the data line 181 via a contact plug 181*cp*. The first source region 121*s* is connected to the gate electrode 143 of the second TFT T2 via a first connection electrode 183. The first channel region 121*c* overlaps with the first gate line 141, and a channel is formed according to a voltage level of the scan signal transferred through the first gate line 141.

The second active region 122 of the second TFT T2 includes the second drain region 122*d*, the second channel region 122*c*, and the second source region 122*s*. The second drain region 122*d* is connected to the third source region 123*s* of the third TFT T3 via the second wiring region 125. The second source region 122*s* is connected to a second connection electrode 184 via the first wiring region 124. The second connection electrode 184 is connected to an upper electrode 161 of the storage capacitor Cst. The second channel region 122*c* overlaps with the gate electrode 143. The second channel region 122*c* may be longer than other channel regions 121*c* and 123, for example, the second channel region 122*c* may have a channel length that is greater than twice the channel length of the first channel region 121*c*.

In an embodiment, where the second channel region 122*c* has a shape that is curved a plurality of times, e.g., an S-shape or an O-shape, the second channel region 122*c* may have a longer channel length within a narrow or limited space. In such an embodiment, the second channel region 122*c* is long, the driving range of the gate voltage applied to the gate T2*g* of the second TFT T2 increases, such that a gray level of the light emitting from the organic light-emitting diode OLED may be accurately adjusted and display quality may be improved.

The third active region 123 of the third TFT T3 includes the third drain region 123*d*, the second lightly doped drain region 123*ldd*, the third channel region 123*c*, the second lightly doped source region 123*lds*, and the third source region 123*s*. The third drain region 123*d* is connected to the power line 182 via a contact plug 182*cp*. The third source region 123*s* is connected to the second drain region 122*d* via the second wiring region 125. Since the third source region 123*s* and the second wiring region 125 are both conductive regions, the third source region 123*s* and the second wiring region 125 may not be physically separate from each other, but are functionally distinguished from each other. The third channel region 123*c* overlaps with the second gate line 142, and a channel is formed according to a voltage level of the control signal transferred through the second gate line 142.

The first insulating layer 130 above the active layer 120 functions as a first gate insulating layer, and may include an inorganic material including oxide or nitride. In one embodiment, for example, the first insulating layer 130 may include an insulating material such as silicon oxide ($SiO_2$), silicon nitride (SiNx), silicon oxynitride (SiON), aluminum oxide ($Al_2O_3$), titanium oxide ($TiO_2$), tantalum oxide ($Ta_2O_5$), hafnium oxide ($HfO_2$) or zinc oxide ($ZnO_2$). The first insulating layer 130 may include a single-layered structure or a multi-layered structure.

The first conductive layer 140 above the first insulating layer 130 includes the first gate line 141, the second gate line 142, and the gate electrode 143. The first conductive layer 140 may include molybdenum (Mo), aluminum (Al), copper (Cu) or titanium (Ti), for example, and may have a single-layered structure or a multi-layered structure. The first conductive layer 140 may be referred to as a first gate electrode layer.

The first gate line 141 extends along the row direction to transfer the scan signal Sn, and is connected to the gate T1*g* of the first TFT T1. In the first gate line 141, a portion overlapping with the first channel region 121*c* may be referred to as a first gate electrode of the first TFT T1.

The second gate line 142 extends along the column direction to transfer the control signal En, and is connected to the gate T3*g* of the third TFT T3. In the second gate line 142, a portion overlapping with the third channel region 123*c* may be referred to as a third gate electrode of the third TFT T1.

The gate electrode 143 overlaps with the second channel region 122*c*, and functions as a gate T2*g* of the second TFT T2. In an embodiment, the gate electrode 143 overlaps with the upper electrode 161, and functions as a first capacitor electrode Cst1 of the storage capacitor Cst. The gate electrode 143 may be referred to as a second gate electrode of the second TFT T2 or the first capacitor electrode Cst1 of the storage capacitor Cst.

The second insulating layer 150 over the first conductive layer 140 may include an inorganic material including oxide or nitride. In one embodiment, for example, the second insulating layer 150 may include an insulating material such as silicon oxide ($SiO_2$), silicon nitride (SiNx), silicon oxynitride (SiON), aluminum oxide ($Al_2O_3$), titanium oxide ($TiO_2$), tantalum oxide ($Ta_2O_5$), hafnium oxide ($HfO_2$) or zinc oxide ($ZnO_2$), and may have a single-layered structure or a multi-layered structure. The second insulating layer 150 may be referred to as a second gate insulating layer.

The second conductive layer 160 over the second insulating layer 150 includes the upper electrode 161. The second conductive layer 160 may include molybdenum (Mo), aluminum (Al), copper (Cu) or titanium (Ti), for example, and may have a single-layered structure or a multi-layered structure. The second conductive layer 160 may be referred to as a second gate electrode layer. The upper electrode 161 overlaps with the gate electrode 143, and functions as a second capacitor electrode Cst2 of the storage capacitor Cst.

The third insulating layer 170 over the second conductive layer 160 may include an inorganic material including oxide or nitride. In one embodiment, for example, the third insulating layer 170 may include an insulating material such as silicon oxide ($SiO_2$), silicon nitride (SiNx), silicon oxynitride (SiON), aluminum oxide ($Al_2O_3$), titanium oxide ($TiO_2$), tantalum oxide ($Ta_2O_5$), hafnium oxide ($HfO_2$) or zinc oxide ($ZnO_2$), and may have a single-layered structure or a multi-layered structure. The third insulating layer 170 may include an organic material. The third insulating layer 170 may be referred to as an interlayer insulating layer.

The third conductive layer 180 over the third insulating layer 170 may include the data line 181, the power line 182, the first and second connection electrodes 183 and 184, and contact plugs 181cp, 182cp, 183cp1, 183cp2, 184cp1, and 184cp2. The third conductive layer 180 may include molybdenum (Mo), aluminum (Al), copper (Cu) or titanium (Ti), for example, and may have a single-layered structure or a multi-layered structure. The third conductive layer 180 may have a multi-layered structure including Ti/Al/Ti. The third conductive layer 180 may be referred to as a source/drain electrode layer.

The data line 181 extends along the column direction to transfer a data signal Dm having a data voltage Vd, and is connected to the first drain region 121d of the first TFT T1 via the contact plug 181cp.

The power line 182 extends along the column direction to transfer the first driving voltage ELVDD, and is connected to the third drain region 123d of the third TFT T3 via a contact plug 182cp.

The first connection electrode 183 is connected to the first source region 121s of the first TFT T1 via a contact plug 183cp1, and is connected to the gate electrode 143 via another contact plug 183cp2. The first connection electrode 183 connects the first source region 121s to the gate electrode 143.

The second connection electrode 184 is connected to the first wiring region 124 via a contact plug 184cp1, and is connected to the upper electrode 161 via another contact plug 184cp2. The second connection electrode 184 connects the second source region 122s of the second TFT T2 to the upper electrode 161.

The fourth insulating layer 190 over the third conductive layer 180 may include an organic material such as acryl, benzocyclobutene ("BCB"), polyimide or hexamethyldisiloxane ("HMDSO"), and may have a single-layered structure or a multi-layered structure. The fourth insulating layer 190 may include an inorganic material. The fourth insulating layer 190 may be referred to as a planarization insulating layer.

The pixel electrode 200 is over the fourth insulating layer 190. The pixel electrode 200 is connected to the second connection electrode 184 via a via plug 200vp that penetrates through the fourth insulating layer 190. The pixel electrode 200 is connected to the second source region 122s of the second TFT T2 and the upper electrode 161 via the second connection electrode 184.

The pixel electrode 200 may be a reflective electrode. In one embodiment, for example, the pixel electrode 200 may include a reflective layer including silver (Ag), magnesium (Mg), aluminum (Al), platinum (Pt), palladium (Pd), gold (Au), nickel (Ni), neodymium (Nd), iridium (Ir), chrome (Cr), or a compound thereof, and a transparent or semi-transparent electrode layer over the reflective layer. The transparent or semi-transparent electrode layer may include at least one electrode material selected from indium tin oxide ("ITO"), indium zinc oxide ("IZO"), zinc oxide (ZnO), indium oxide ($In_2O_3$), indium gallium oxide, and aluminum zinc oxide ("AZO").

A pixel-defining layer 210 exposing a part of the pixel electrode 200 is disposed on the pixel electrode 200. The pixel-defining layer 210 may include at least one organic insulating materials selected from polyimide, polyamide, acryl resin, BCB, and phenol resin.

The emission layer 220 is over the part of the pixel electrode 200, which is exposed by the pixel-defining layer 210. The emission layer 220 may include an organic material including a fluorescent or phosphor material that emits red, green, blue, or white light. The emission layer 220 may include low-molecular weight organic materials or polymer materials.

Although not shown in the drawings, the emission layer 220 may selectively include a hole injection layer ("HIL"), a hole transport layer ("HTL"), an emission layer ("EML"), an electron transport layer ("ETL"), and an electron injection layer ("EIL") on upper and lower portions thereof.

The common electrode 230 may be a transmissive electrode. In one embodiment, for example, the common electrode 230 may be a transparent or a semi-transparent electrode, and may include a metal thin film of a small work function including lithium (Li), calcium (Ca), lithium fluoride/calcium (LiF/Ca), lithium fluoride/aluminum (LiF/Al), aluminum (Al), silver (Ag), magnesium (Mg), or a compound thereof. In such an embodiment, a transparent conductive oxide ("TCO") such as ITO, IZO, ZnO, or $In_2O_3$ may be further provided over the metal thin film.

A substrate on which the first and second TFTs T1 and T2 described above with reference to FIGS. 3 and 4 are disposed may be referred to as a TFT substrate. When a light-emitting device such as the organic light-emitting diode OLED or a display device such as a liquid crystal layer is provided over the TFT substrate, the display apparatus 100 shown in FIG. 1 may be manufactured.

Hereinafter, an embodiment of a method of manufacturing the first and second TFTs T1 and T2 shown in FIGS. 3 and 4 will be described in detail.

FIGS. 5A to 5D are cross-sectional views illustrating a method of manufacturing first and second TFTs of FIGS. 3 and 4 according to an embodiment. The cross-sectional views of FIGS. 5A to 5D are corresponding to the cross-sectional views taken along line A-A' and line B-B' of FIG. 3.

In an embodiment, as described above, the first TFT T1 includes the first active region 121 including the first drain region 121*d*, the first lightly doped drain region 121*lds*d, the first channel region 121*c*, the first lightly doped source region 121*lds*, and the first source region 121*s*, which are continuously arranged along a lengthwise direction thereof. The second TFT T2 includes the second active region 122 having the second drain region 122*d*, the second channel region 122*c*, and the second source region 122*s*, which are continuously arranged along a lengthwise direction thereof. The impurity concentrations in the second drain region 122*d* and the second source region 122*s* may be substantially equal to the impurity concentrations of the first lightly doped drain region 121*ldd* and the first lightly doped source region 121*lds*. The second drain region 122*d* and the second source region 122*s* may be connected to the second and first wiring regions 125 and 124, respectively.

Hereinafter, for convenience of description, an embodiment, where the first drain region 122*d*, the first source region 121*s*, and the first and second wiring regions 124 and 125 have the first impurity concentration, the first lightly doped drain region 121*ldd*, the first lightly doped source region 121*lds*, the second drain region 122*d* and the second source region 122*s* have the second impurity concentration that is lower than the first impurity concentration, and the first and second channel regions 121*c* and 122*c* have the third impurity concentration that is lower than the second impurity concentration, will be described. In such an embodiment, the impurities are n-type impurities. In FIGS. 5A to 5D, the substrate 110, the buffer layer 111 and the first insulating layer 130 are the same as those described above with reference to FIGS. 3 and 4, and any repetitive detailed descriptions thereof will be omitted.

Figure 5A:
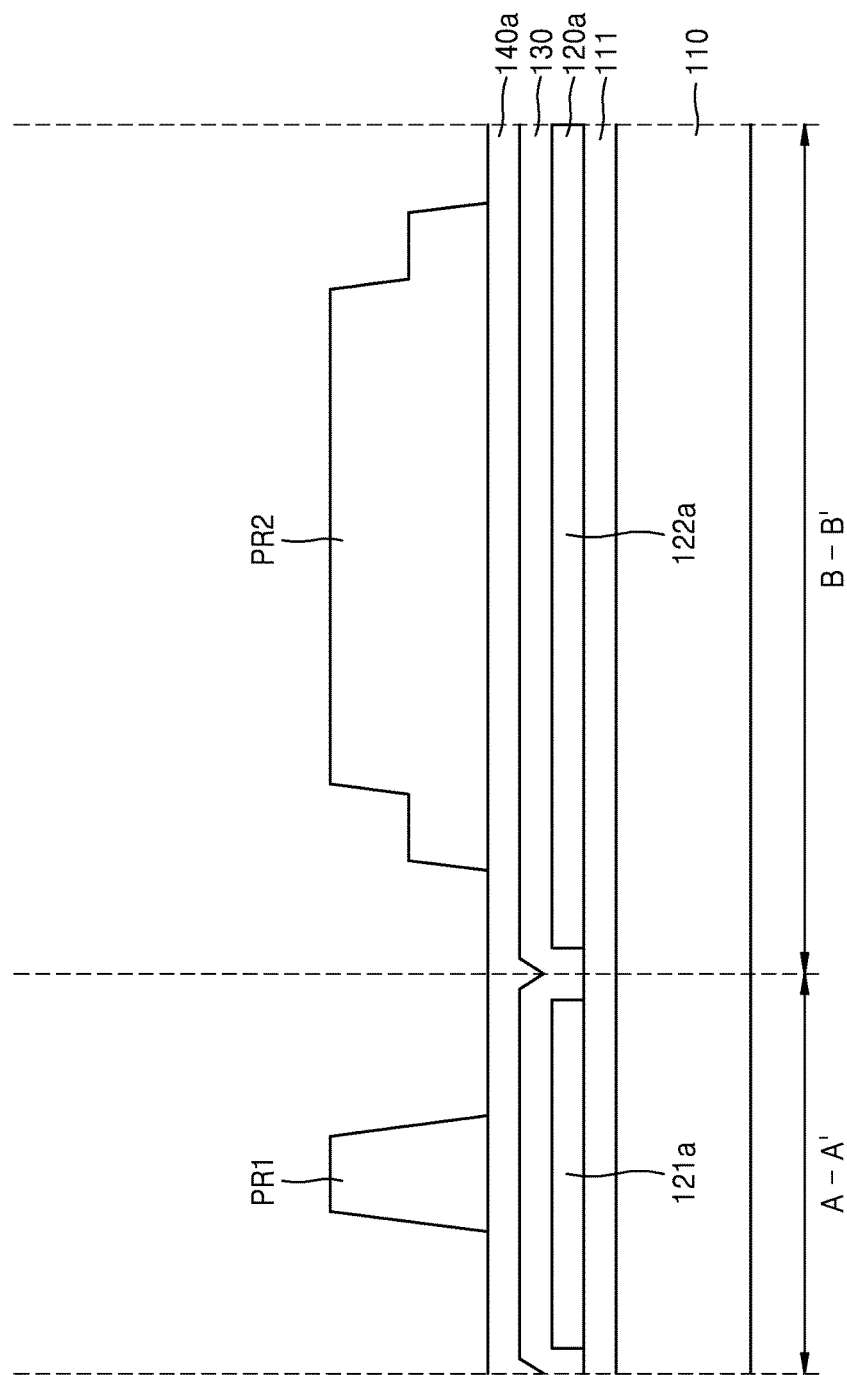
FIGS. 5A to 5D are cross-sectional views illustrating a method of manufacturing first and second TFTs of FIGS. 3 and 4 according to an embodiment.

Referring to FIG. 5A, an active layer 120*a* is provided over the buffer layer 111. The active layer 120*a* includes a first area 121*a* that is to be the first active region 121 of the first TFT T1 and a second area 122*a* that is to be the second active region 122 of the second TFT T2 and the first and second wiring regions 124 and 125 connected to the second active region 122. In such an embodiment, the active layer 120 shown in FIG. 5A has the third impurity concentration that is equal to those of the first and second channel regions 121*c* and 122*c* since the active layer 120*a* has not been through an impurity injection process.

The first insulating layer 130 is arranged over the active layer 120*a*. A conductive material layer 140*a* that is to be the first conductive layer 140 is arranged over the first insulating layer 130.

A first photoresist pattern PR1 for forming the first gate electrode 141 and a second photoresist pattern PR2 for forming the second gate electrode 143 are arranged over the conductive material layer 140*a*. The first photoresist pattern PR1 has a size that may cover the first active region 121, where the first lightly doped drain region 121*ldd*, the first channel region 121*c* and the first lightly doped source region 121*lds* are to be provided. Edges of the first photoresist pattern PR1 may define a boundary between the first drain region 121*d* and the first lightly doped drain region 121*ldd* and a boundary between the first lightly doped source region 121*lds* and the first source region 121*s*.

In such an embodiment, as shown in FIG. 5A, the second photoresist pattern PR2 has a thinner portion corresponding to the second drain region 122*d* and the second source region 122*s* and a thicker portion corresponding to the second channel region 122*c*. The second photoresist pattern PR2 defines a boundary between the first and second wiring regions 124 and 125 and the second active region 122.

Figure 5B:
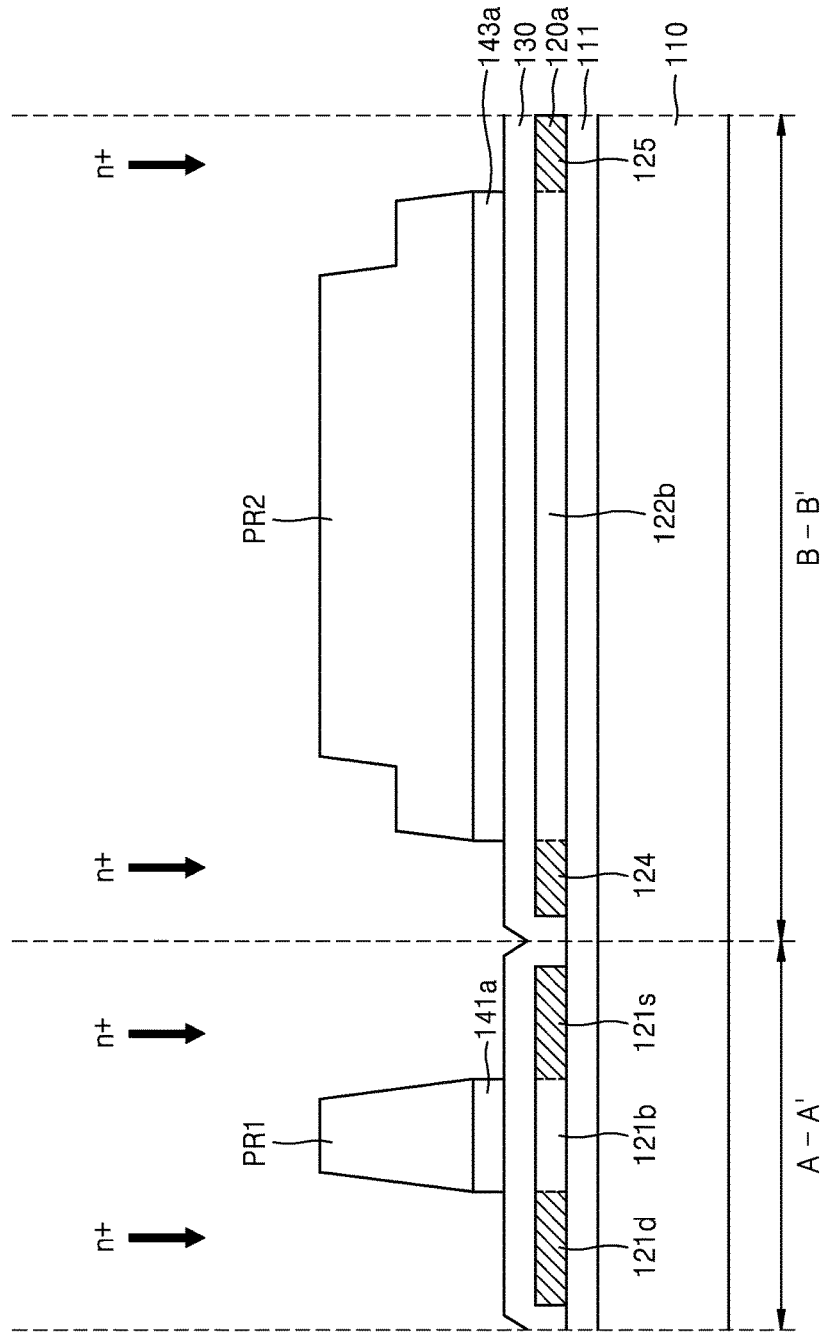

Referring to FIG. 5B, the conductive material layer 140*a* is etched by using the first photoresist pattern PR1 and the second photoresist pattern PR2 as a mask to form a first electrode 141*a* and a second electrode 143*a*.

When impurities of high concentration are injected to the active layer 120*a* by using the first electrode 141*a* and the second electrode 143*a* as a mask, an active layer 120*b* including the first drain region 121*d*, the first source region 121*s*, and the first and second wiring regions 145 and 146 is obtained. The first drain region 121*d*, the first source region 121*s*, and the first and second wiring regions 145 and 146 have the first impurity concentration by such an impurity injection process.

A region 121*b* between the first drain region 121*d* and the first source region 121*s* still has the third impurity concentration, and a region 122*b* between the first and second wiring regions 145 and 146 has the third impurity concentration.

Figure 5C:
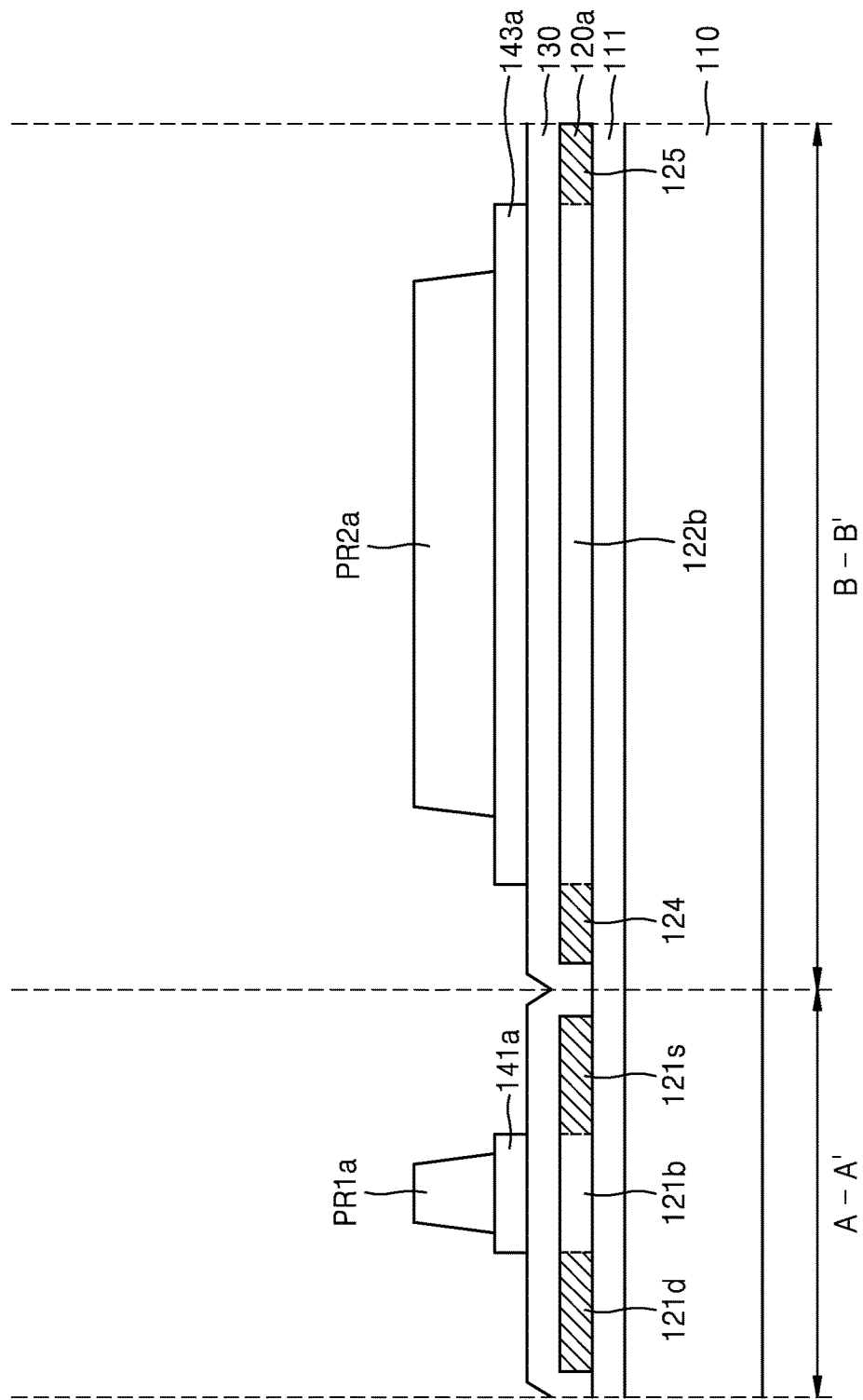

Referring to FIG. 5C, an ashing process is performed on the first photoresist pattern PR1 and the second photoresist pattern PR2 to obtain a first residual pattern PR1*a* and a second residual pattern PR2*b*.

A size of the first residual pattern PR1*a* is reduced less than that of the first photoresist pattern PR1, and may cover the first active region 121 where the first channel region 121*c* may be provided. Edges of the first residual pattern PR1*a* define a planar shape of the first gate electrode 141. The edges of the first residual pattern PR1*a* define a boundary between the first lightly doped drain/source regions 121*ldd* and 121*lds* and the first channel region 121*c*.

The second residual pattern PR2*b* corresponds to the thicker portion of the second photoresist pattern PR2, where the thicker portion corresponds to the second channel region 122*c*. Due to the ashing process, the thinner portion in the second photoresist pattern PR2 may be removed. Edges of the second residual pattern PR2*b* define a planar shape of the second gate electrode 143. The edges of the second residual pattern PR2*b* define a boundary between the second drain/source regions 122*d* and 122*s* and the second channel region 122*c*.

Figure 5D:
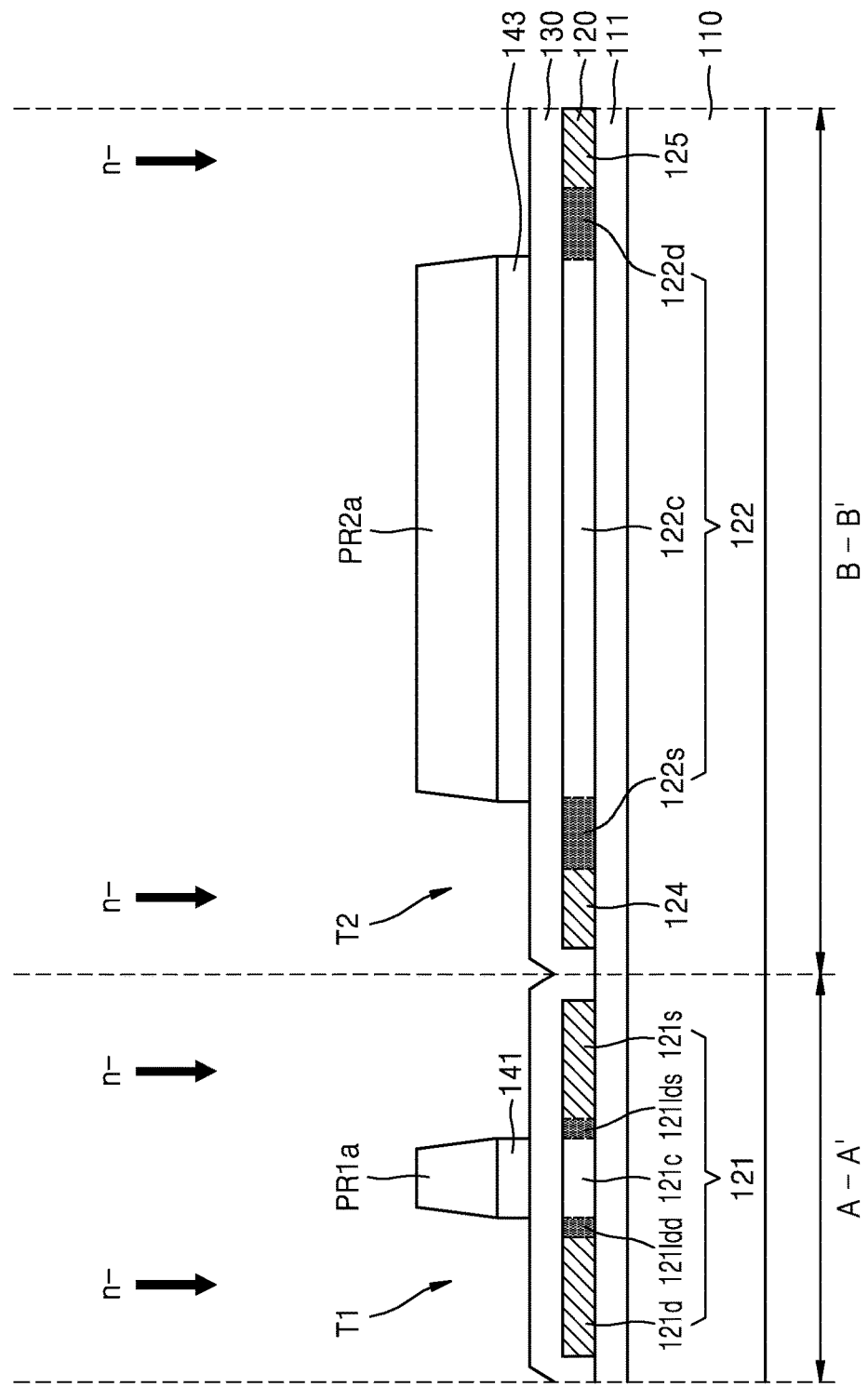

Referring to FIG. 5D, the first and second electrodes 141*a* and 143*a* are etched by using the first residual pattern PR1*a* and the second residual pattern PR2*b* to obtain the first and second gate electrodes 141 and 143.

When impurities of low concentration are injected by using the first and second gate electrodes 141 and 143 as a mask to obtain the active layer 120 including the first lightly doped drain region 121*ldd*, the first lightly doped source region 121*lds*, the second drain region 122*d*, and the second source region 122*s*. The first lightly doped drain region 121*ldd*, the first lightly doped source region 121*lds*, the second drain region 122*d*, and the second source region 122*s* have the second impurity concentrations by such an impurity injection process.

The first channel region 121*c* having the third impurity concentration is disposed between the first lightly doped drain region 121*ldd* and the first lightly doped source region 121*lds*, and the second channel region 122*c* having third impurity concentration is disposed between the second drain region 122*d* and the second source region 122*s*.

Accordingly, the first active region 121 includes the first drain region 121*d*, the first lightly doped drain region 121*ldd*, the first channel region 121*c*, the first lightly source region 121*lds* and the first source region 121*s*, and the second active region 122 includes the second drain region 122*d*, the second channel region 122*c* and the second source region 122*s*.

Subsequently, the first residual pattern PR1*a* and the second residual pattern PR2*a* are removed, and the first TFT T1 including the first active region 121 and the first gate electrode 141 and the second TFT T2 including the second active region 122 and the second gate electrode 143 are obtained.

Figure 6:
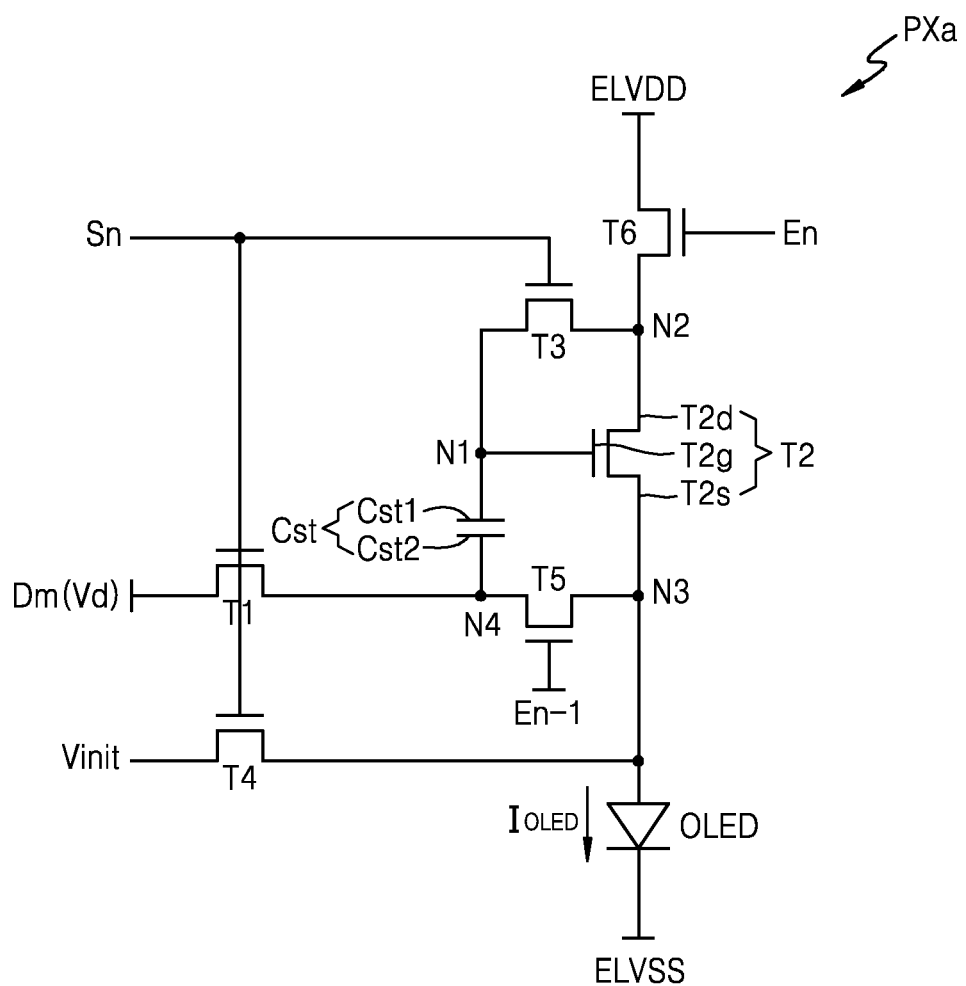
FIG. 6 is an equivalent circuit diagram of a pixel according to an alternative embodiment.
Figure 7:
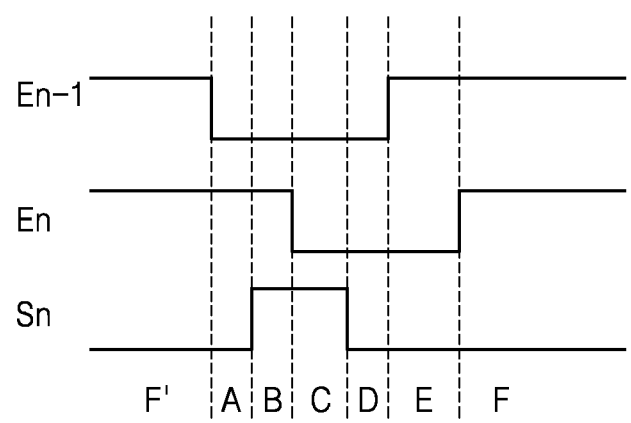
FIG. 7 is a timing diagram of signals for driving the pixel of FIG. 6.

FIG. 6 is an equivalent circuit diagram of a pixel PXa according to an alternative embodiment, and FIG. 7 is a timing diagram of signals for driving the pixel PXa of FIG. 6.

Referring to FIG. 6, an embodiment of the pixel PXa includes a pixel circuit including first to sixth TFTs T1 to T6 and a storage capacitor Cst, and an organic light-emitting diode OLED.

The pixel circuit receives a scan signal Sn, a first control signal En-1, and a second control signal En through gate lines. The first control signal En-1 may be equal to the second control signal En that is applied to a pixel that is adjacent to the pixel PXa in the column direction. The pixel circuit receives a data signal Dm having a data voltage Vd via a data line. A first driving voltage ELVDD is applied to the pixel circuit via a power line, and an initialization voltage Vinit is applied to the pixel circuit via an initialization voltage line. A second driving voltage ELVSS is applied to a cathode of the organic light-emitting diode OLED. The pixel PXa may be one of the pixels PX included in the display apparatus of FIG. 1. FIG. 6 merely shows an exemplary embodiment of the pixel PXa, and one or more embodiments are not limited thereto.

The first to sixth TFTs T1 to T6 may be respectively referred to as a switching transistor T1, a driving transistor T2, a compensation transistor T3, an initialization transistor T4, a first control transistor T5 and a second control transistor T6. In the driving transistor T2, a gate T2g is defined as a first node N1, a drain T2d is defined as a second node N2, and a source T2s is defined as a third node N3. A second capacitor electrode Cst2 of the storage capacitor Cst is defined as a fourth node N4.

In FIG. 6, the first to sixth TFTs T1 to T6 are n-type MOS transistors, but are not limited thereto. Alternatively, the first to sixth TFTs T1 to T6 may be p-type MOS transistors.

The driving transistor T2 includes the gate T2g connected to the first node N1, the drain T2d connected to the second node N2, and the source T2s connected to the third node N3. The driving transistor T2 generates a driving current $I_{DLED}$ corresponding to a voltage obtained by subtracting the threshold voltage (Vth) of the driving transistor T2 from a gate-source voltage (Vgs) between the gate T2g and the source T2s (e.g., Vgs–Vth), and outputs the driving current $I_{OLED}$ to the organic light-emitting diode OLED.

The switching transistor T1 transfers the data signal Dm having the data voltage Vd to the fourth node N4 in response to the scan signal Sn. The data voltage Vd is applied to the second capacitor electrode Cst2.

The control transistor T3 connects the second node N2 to the first node N1 in response to the scan signal Sn. The control transistor T3 may make a diode connection of the driving transistor T2 by connecting the gate T2g and the drain T2d of the driving transistor T2 to each other in response to the scan signal Sn.

The initialization transistor T4 transfers the initialization voltage Vinit to the third node N3, in response to the scan signal Sn. The initialization voltage Vinit may have a level that is similar to that of the second driving voltage ELVSS. A difference between the level of the initialization voltage Vinit and the level of the second driving voltage ELVSS is smaller than a level of the threshold voltage of the organic light-emitting diode OLED. When the initialization voltage Vinit is applied to the third node N3, charges stored in the organic light-emitting diode OLED are discharged through the initialization transistor T4, and the organic light-emitting diode OLED does not emit light.

The first control transistor T5 connects the third node N3 to the fourth node N4 in response to the first control signal En-1. Accordingly, a voltage between opposite ends of the storage capacitor Cst is the gate-source voltage (Vgs) of the driving transistor T2.

The control transistor T6 applies the first driving voltage ELVDD to the second node N2 in response to the second control signal En. When the second control transistor T6 is turned on in response to the second control signal En, a current path passing through the driving transistor T2 is generated between a first voltage source that outputs the first driving voltage ELVDD and a second voltage source that outputs the second driving voltage ELVSS.

The storage capacitor Cst includes a first capacitor electrode Cst1 connected to the first node N1, and a second capacitor electrode Cst2 connected to the fourth node N4.

The organic light-emitting diode OLED includes an anode connected to the third node N3 and a cathode to which the second driving voltage ELVSS is applied. The organic light-emitting diode OLED emits light by receiving the driving current $I_{DLED}$ output from the driving transistor T2.

According to such embodiments, at least one of the switching transistor T1, the compensation transistor T3, the initialization transistor T4, the first control transistor T5, and the second control transistor T6 may include the first active region 121 having the first drain region 121d, the first lightly doped drain region 121ldd, the first channel region 121c, the first lightly doped source region 121lds, and the first source region 121s. The driving transistor T2 may include the second active region 122 having the second drain region 122d, the second channel region 122c, and the second source region 122s, and the impurity concentration of the second drain/source regions 122d and 122s may be lower than the impurity concentration of the first drain/source regions 121d and 121s and higher than the impurity concentration of the second channel region 122c.

An operation of the pixel PXa of FIG. 6 will hereinafter be described in detail.

Referring to FIG. 7, a section F' corresponds to a light-emitting section in a previous period. Here, since the scan signal Sn has a low level, the switching transistor T1, the compensation transistor T3, and the initialization transistor T4 are all turned off. Since the first and second control signals En-1 and En have high levels, the first and second control transistors T5 and T6 are turned on. The driving transistor T2 generates the driving current $I_{OLED}$ having a magnitude that is determined according to the gate-source voltage (Vgs), and the organic light-emitting diode OLED emits light according to the driving current $I_{OLED}$.

During a first section A, the first control signal En-1 has a low level, and the first control transistor T5 is turned off. The gate T2g of the driving transistor T2 is floated by the turned-off first control transistor T5, the driving transistor T2 is turned off and output of the driving current $I_{OLED}$ is terminated. The voltage at the third node N3 is decreased to a threshold voltage of the organic light-emitting diode OLED, and the organic light-emitting diode OLED does not emit light.

During a second section B, the scan signal Sn enters a high level, and the switching transistor T1, the compensation transistor T3, and the initialization transistor T4 are all turned on. The initialization voltage is applied to the third node N3 by the turned-on initialization transistor T4, and a voltage between the opposite ends of the organic light-emitting diode OLED becomes lower than the threshold voltage, and accordingly, non-emission state of the organic light-emitting diode OLED may be maintained.

The first driving voltage ELVDD is applied to the first node N1, e.g., the gate T2g of the driving transistor T2, by the turned-on compensation transistor T3. Since the initialization voltage Vinit is applied to the third node N3, e.g., the source T2s of the driving transistor T2, by the turned-on initialization transistor T4, the gate-source voltage of the driving transistor T2 becomes ELVDD-Vinit and the driving transistor T2 is completely turned on. Accordingly, the driving transistor T2 is initialized to remove hysteresis characteristics.

The data voltage Vd is applied to the fourth node N4, e.g., the second capacitor electrode Cst2 of the capacitor Cst, by the turned-on switching transistor T1.

During a third section C, the second control signal En enters a low level, and the second control transistor T6 is turned off. The driving transistor T2 is diode-connected by the turned-on compensation transistor T3, and the first node N1, e.g., the first capacitor electrode Cst1, has an electric potential of a level obtained by adding the initialization voltage Vinit to the threshold voltage (Vth) of the driving transistor T2, i.e., Vinit+Vth.

Since the data voltage Vd is applied to the second capacitor electrode Cst2 by the turned-on switching transistor T1, a voltage (Vinit+Vth−Vdata) is applied to opposite ends of the storage capacitor Cst.

During a fourth section D, the scan signal Sn has a low level, and the switching transistor T1, the compensation transistor T3 and the initialization transistor T4 are all turned off. The storage capacitor Cst stores the voltage (Vinit+Vth−Vdata) applied thereto.

During a fifth section E, the first control signal En-1 has a high level, and the first control transistor T5 is turned on. The voltage (Vinit+Vth−Vdata) stored in the storage capacitor Cst is applied between the gate T2g and the source T2s of the driving transistor T2 by the turned-on first control transistor T5, and the gate-source voltage of the driving transistor T2 is equal to the voltage (Vinit+Vth−Vdata) stored in the storage capacitor Cst. The driving transistor T2 generates the driving current $I_{OLED}$ having a magnitude that is determined according to a voltage (Vinit−Vdata) obtained by subtracting the threshold voltage (Vth) from the gate-source voltage (Vinit+Vth−Vdata).

During a sixth section F, the second control signal En has a high level, and the second control transistor T6 is turned on. The turned-on second control transistor T6 generates a current path passing through the driving transistor T2 between the first voltage source that outputs the first driving voltage ELVDD and the second voltage source that outputs the second driving voltage ELVSS. The driving transistor T2 generates the driving current $I_{OLED}$ having a magnitude that is proportional to a square of a voltage (Vinit−Vdata) that is irrelevant with the threshold voltage Vth, and the driving current $I_{OLED}$ flows through the organic light-emitting diode OLED along the current path. The organic light-emitting diode OLED emits light of a desired luminance by using the driving current $I_{OLED}$.

It should be understood that embodiments described herein should be considered in a descriptive sense only and not for purposes of limitation. Descriptions of features or aspects within each embodiment should typically be considered as available for other similar features or aspects in other embodiments.

While one or more embodiments have been described with reference to the figures, it will be understood by those of ordinary skill in the art that various changes in form and details may be made therein without departing from the spirit and scope as defined by the following claims.

What is claimed is:
1. A thin film transistor substrate comprising:
   a substrate;
   an active layer over the substrate;
   a first thin film transistor over the substrate; and
   a second thin film transistor over the substrate,
   wherein the active layer comprises:
      a first drain region, a first channel region and a first source region, which function as a drain, a channel and a source of the first thin film transistor, respectively;
      a first lightly doped region between the first drain region and the first channel region;
      a second lightly doped region between the first channel region and the first source region; and
      a second drain region, a second channel region and a second source region, which function as a drain, a channel and a source of the second thin film transistor, respectively,
   wherein an impurity concentration at the second drain region and the second source region is lower than an impurity concentration at the first drain region and the first source region, and higher than an impurity concentration at the first channel region and the second channel region.

2. The thin film transistor substrate of claim 1, wherein the impurity concentration at the second drain region and the second source region is substantially equal to an impurity concentration at the first lightly doped region and the second lightly doped region.

3. The thin film transistor substrate of claim 1, wherein
   each of the first drain region and the first source region has a first impurity concentration,
   each of the first lightly doped region, the second lightly doped region, the second drain region and the second source region has a second impurity concentration, which is lower than the first impurity concentration, and
   each of the first channel region and the second channel region has a third impurity concentration, which is lower than the second impurity concentration.

4. The thin film transistor substrate of claim 1, wherein a channel length of the second channel region is greater than a channel length of the first channel region.

5. The thin film transistor substrate of claim 1, wherein a length of the second source region is greater than twice a length of the second lightly doped region.

6. The thin film transistor substrate of claim 1, wherein a length of the second source region is greater than half a channel width of the second channel region.

7. The thin film transistor substrate of claim 1, wherein a length of the second source region is greater than about 1 micrometer.

8. The thin film transistor substrate of claim 1, wherein the second channel region is directly connected between the second drain region and the second source region.

9. The thin film transistor substrate of claim 1, wherein
   the active layer further comprises a wiring region directly connected to at least one of the second drain region and the second source region, and
   an impurity concentration at the wiring region is substantially equal to an impurity concentration at the first drain region and the first source region.

10. The thin film transistor substrate of claim 1, wherein a conductive type of the first and second TFTs is n-type.

11. A display apparatus comprising:
a substrate;
pixels arranged over the substrate, wherein each of the pixels comprises a first thin film transistor, a second thin film transistor and a display element; and
an active layer disposed over the substrate, wherein the active layer comprises a first drain region, a first lightly doped region, a first channel region, a second lightly doped region and a first source region,
wherein the first thin film transistor comprises the first drain region, the first lightly doped region, the first channel region, the second lightly doped region and the first source region, which are continuously arranged along a lengthwise direction thereof,
the second thin film transistor comprises a second drain region, a second channel region and a second source region, which are continuously arranged along a lengthwise direction thereof, and
an impurity concentration at the second drain region and the second source region is substantially equal to an impurity concentration at the first lightly doped region and the second lightly doped region.

12. The display apparatus of claim 11, wherein
each of the first drain region and the first source region has a first impurity concentration,
each of the first lightly doped region, the second lightly doped region, the second drain region and the second source region has a second impurity concentration, which is lower than the first impurity concentration, and
each of the first channel region and the second channel region has a third impurity concentration, which is lower than the second impurity concentration.

13. The display apparatus of claim 12, wherein
the active layer further comprises a wiring region directly connected to at least one of the second drain region and the second source region, and
the wiring region has the first impurity concentration.

14. The display apparatus of claim 11, wherein an area of the second drain region or the second source region is greater than twice an area of the first lightly doped region or the second lightly doped region.

15. The display apparatus of claim 11, wherein
the second thin film transistor generates a driving current corresponding to a voltage between a gate electrode overlapping with the second channel region and the second source region, and
the second thin film transistor outputs the driving current to a pixel electrode.

16. The display apparatus of claim 11, wherein a channel length of the second TFT is greater than twice a channel length of the first thin film transistor.

17. The display apparatus of claim 11, further comprising:
a gate line over the substrate; and
a data line over the substrate,
wherein a part of the gate line overlaps with the first channel region to function as a gate electrode of the first thin film transistor, and
the data line is connected to the first source region.

18. The display apparatus of claim 11, further comprising:
first to third gate lines which transfer a scan signal, a first control signal and a second control signal, respectively; and
a data line which transfers a data signal, and
each of the pixels comprises:
a driving transistor including a gate electrode connected to a first node, a drain connected to a second node, and a source connected to a third node;
a storage capacitor connected between the first node and a fourth node;
a switching transistor which transfers the data signal to the fourth node in response to the scan signal;
an initialization transistor which transfers an initialization voltage to the third node in response to the scan signal;
a compensation transistor which connects the first node to the second node in response to the scan signal;
a first control transistor which connects the third node to the fourth node in response to the first control signal;
a second control transistor which applies a first driving voltage to the second node in response to the second control signal; and
the display element having an anode connected to the third node and a cathode to which a second driving voltage is applied.

19. The display apparatus of claim 18, wherein
the second thin film transistor is the driving transistor, and
the first thin film transistor is at least one of the switching transistor, the initialization transistor, the compensation transistor, the first control transistor and the second control transistor.

20. The display apparatus of claim 11, wherein a conductive type of the first and second thin film transistor is n-type.

* * * * *